(12) United States Patent
Petenyi (10) Patent No.: US 11,005,483 B2
(45) Date of Patent: May 11, 2021

(54) CHARGE PUMP WITH LOAD DRIVEN CLOCK FREQUENCY MANAGEMENT

(71) Applicant: STMicroelectronics Design and Application S.R.O., Prague (CZ)

(72) Inventor: Sandor Petenyi, Lysa nad Labem (CZ)

(73) Assignee: STMicroelectronics Design and Application S.R.O., Prague (CZ)

( * ) Notice: Subject to any disclaimer, the term of this patent is extended or adjusted under 35 U.S.C. 154(b) by 0 days.

(21) Appl. No.: 16/987,833

(22) Filed: Aug. 7, 2020

(65) Prior Publication Data

US 2020/0366296 A1 Nov. 19, 2020

Related U.S. Application Data

(62) Division of application No. 16/353,122, filed on Mar. 14, 2019, now Pat. No. 10,784,876.

(51) Int. Cl.
| | |
|---|---|
| *H02M 3/04* | (2006.01) |
| *H02M 3/07* | (2006.01) |
| *G05F 1/10* | (2006.01) |
| *G05F 3/26* | (2006.01) |
| *H03L 7/089* | (2006.01) |
| *H02M 3/335* | (2006.01) |
| *G11C 11/4074* | (2006.01) |
| *G11C 5/14* | (2006.01) |

(52) U.S. Cl.
CPC ............ *H03L 7/0891* (2013.01); *G11C 5/145* (2013.01); *G11C 11/4074* (2013.01); *H02M 3/33507* (2013.01)

(58) Field of Classification Search
None
See application file for complete search history.

(56) References Cited

U.S. PATENT DOCUMENTS

| | | |
|---|---|---|
| 5,227,675 A | 7/1993 | Taguchi |
| 5,258,662 A | 11/1993 | Skovmand |
| 6,980,047 B1 | 12/2005 | Kuo |
| 7,276,960 B2 | 10/2007 | Peschke |
| 7,486,128 B2 | 2/2009 | Yen et al. |
| 7,692,479 B2 | 4/2010 | Fukami |
| 7,782,141 B2 | 8/2010 | Witmer et al. |
| 7,821,328 B2 | 10/2010 | Hogue et al. |
| 7,956,675 B2 | 6/2011 | Saitoh et al. |
| 8,102,157 B2 | 1/2012 | Abe |
| 8,665,009 B2 | 3/2014 | Myers et al. |
| 8,995,154 B2 | 3/2015 | Kaneda |

(Continued)

*Primary Examiner* — Kenneth B Wells
(74) *Attorney, Agent, or Firm* — Crowe & Dunlevy (57) ABSTRACT

A circuit includes a current controlled oscillator (CCO), and a charge pump circuit boosting a supply voltage to produce a charge pump output voltage at a charge pump output node in response to output from the CCO. A current sensing circuit includes a first resistor coupled between the charge pump output node and an output node, a first transistor having a first conduction terminal coupled to the charge pump output node through a second resistor, and a second conduction terminal coupled to an input of the CCO. A second transistor has a first conduction terminal coupled to the output node, a second conduction terminal coupled to a reference current source, and a control terminal coupled to the control terminal of the first transistor and to the second conduction terminal of the second transistor.

16 Claims, 6 Drawing Sheets

(56) References Cited

U.S. PATENT DOCUMENTS

| | | | |
|---|---|---|---|
| 9,164,526 B2 | 10/2015 | Pan et al. | |
| 9,264,053 B2 | 2/2016 | Englekirk | |
| 10,128,746 B2 | 11/2018 | Larsen et al. | |
| 10,784,876 B1 * | 9/2020 | Petenyi | G11C 11/4074 |
| 2018/0248477 A1 | 8/2018 | Kline et al. | |

* cited by examiner

CHARGE PUMP WITH LOAD DRIVEN CLOCK FREQUENCY MANAGEMENT

RELATED APPLICATION

This application is a divisional of U.S. application for patent Ser. No. 16/353,122, filed Mar. 14, 2019, now U.S. Pat. No. 10,784,876 the contents of which are incorporated by reference to the maximum extent allowable under the law.

TECHNICAL FIELD

This application is directed to the field of charge pump technology, and in particular, to a charge pump circuit utilizing a load current as feedback to adjust an oscillator within the charge pump circuit.

BACKGROUND

Charge pumps are routinely used in analog electronic circuits to boost a voltage or invert a voltage without the use of an inductor. A typical charge pump utilizes switched capacitors operated by a clock signal generated by an oscillator. Such charge pumps are effective at the goals of voltage boosting or voltage inversion.

However, in some (or most) instances, the output of a charge pump is provided to a variable load, meaning that the load draws different amount of currents at different times. Since, as explained, capacitors are used by a charge pump to provide a boosted voltage, it should be appreciated that as current is delivered by a charge pump, charge stored by those capacitors is depleted. Therefore, when sufficient current is delivered by a charge pump, the voltage output by the charge pump would fall. Since the frequency of the oscillator used to operate the charge pump in part determines the speed at which the capacitors are recharged, it can be appreciated that in order to maintain the voltage output by the charge pump at a consistent level despite the current drawn by the load, the frequency at which the oscillator operates must be sufficiently high.

One solution is to simply set the frequency of the oscillator at a constant frequency sufficiently high such that in a worst case operating scenario, the capacitors are recharged quickly enough to maintain the voltage output by the charge pump at a consistent level regardless of the current drawn by the load. However, the drawback to this is that when the load is not drawing much current, losses due to switching within the charge pump are high. Another solution is to operate the oscillator in a pulse skipping mode where the oscillator is enabled when current at the load is required and disabled otherwise. This can be sufficient in reducing pump losses at times when the load is not drawing much current. However, the drawback to this is that pulse skipping introduces undesirable harmonics, which can be particularly undesirable when a charge pump is used to drive a ballast transistor as a power source.

As such, further development in the area of charge pump technology is needed.

SUMMARY

Disclosed herein is a circuit including: a current controlled oscillator (CCO); a charge pump circuit configured to boost a supply voltage to produce a charge pump output voltage at a charge pump output node, in response to output from the CCO; and a current sensing circuit. The current sensing circuit includes: a first resistor coupled between the charge pump output node and an output node; a first transistor having a first conduction terminal coupled to the charge pump output node through a second resistor, a second conduction terminal coupled to an input of the CCO, and a control terminal; and a second transistor having a first conduction terminal coupled to the output node, a second conduction terminal coupled to a reference current source, and a control terminal coupled to the control terminal of the first transistor and to the second conduction terminal of the second transistor.

Also disclosed herein is a circuit, including: a current controller oscillator (CCO) configured to generate a CCO output signal at a CCO output that has a frequency that is generally proportional to a feedback current; a charge pump circuit operated by the CCO output signal and configured to boost a supply voltage to produce a charge pump output voltage at an output, wherein the output is coupled to a load; and a current sensing circuit configured to sense a load current drawn by the load and to generate the feedback current as having a magnitude that varies as a function of the sensed load current if a magnitude of the load current is between a lower load current threshold and an upper load current threshold. The current sensing circuit includes: a first resistor coupled between a node and the output; a diode coupled between the node and the output; a second resistor having a first terminal coupled to the node; a first transistor having a first conduction terminal coupled to a second terminal of the second resistor, a second conduction terminal coupled to the CCO, and a control terminal; and a second transistor having a first conduction terminal coupled to the output, a second conduction terminal coupled to a reference current source to receive a reference current therefrom, and a control terminal to the control terminal of the first transistor and to the second conduction terminal of the second transistor; wherein the first transistor generates the feedback current at its second conduction terminal.

Further disclosed herein is a circuit, including: a current controller oscillator (CCO) having a CCO input and a CCO output; and a charge pump circuit. The charge pump circuit includes: first, second, and third capacitors; first and second inverters coupled in series between the CCO output and a first plate of the first capacitor; a third inverter coupled between the CCO output and a first plate of the second capacitor; and a bridge rectifier. The bridge rectifier includes: a first diode coupled between a first node and a second node; a second diode coupled between the first node and a third node; a third diode coupled between the third node and a fourth node; and a fourth diode coupled between the fourth node and the second node; wherein a second plate of the first capacitor is coupled to the first node; wherein a second plate of the second capacitor is coupled to the fourth node; and wherein the third capacitor has a first plate coupled to a supply voltage and the third node and a second plate coupled to an output of the circuit and the second node. A current sensing circuit includes: a first resistor coupled between a second node and the output; a diode coupled between the second node and the output; a second resistor having a first terminal coupled to the second node; a first transistor having a first conduction terminal coupled to a second terminal of the second resistor, a second conduction terminal coupled to the CCO input, and a control terminal; and a second transistor having a first conduction terminal coupled to the output, a second conduction terminal coupled to a reference current source to receive a reference current therefrom, and a control terminal coupled to the control terminal of the first transistor and to the second conduction terminal of the second transistor.

DETAILED DESCRIPTION

The following disclosure enables a person skilled in the art to make and use the subject matter disclosed herein. The general principles described herein may be applied to embodiments and applications other than those detailed above without departing from the spirit and scope of this disclosure. This disclosure is not intended to be limited to the embodiments shown, but is to be accorded the widest scope consistent with the principles and features disclosed or suggested herein. Note that in this detailed description section, where components are described as being "coupled", it means that those components can be directly electrically connected without intervening components, or connected through other components.

Figure 1A:
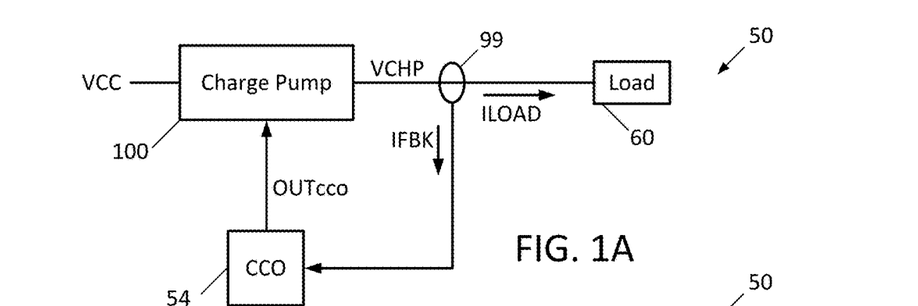
FIG. 1A is a block diagram of an electronic device utilizing a charge pump circuit to drive a load, in accordance with this disclosure.

First disclosed with reference to FIG. 1A is an electronic device 50 including a charge pump circuit 100 to boost a supply voltage VCC to a charge pump output voltage VHCP which is applied to a load 60. The load 60 draws a load current ILOAD. A current sensor 99 senses the load current ILOAD and generates a feedback current IFBK that is representative of the load current ILOAD (for example, having a magnitude that varies as a function of the load current ILOAD, such as by being proportional to the load current).

A current controller oscillator (CCO) 54 receives the feedback current IFBK and generates a CCO output signal OUTcco that has a frequency that is a function of the received feedback current IFBK (for example, being nearly proportional to, proportional to, directly proportional to, or in another relationship with). Therefore, as the magnitude of the feedback current IFBK increases, the frequency of the CCO output signal OUTcco increases.

In general, the charge pump 100 includes a driver and a rectifier. The driver can be any switching circuit generating a rectangular signal, and the rectifier can be any circuit commutating in correct phases for delivering a pumped charge into its output capacitance.

Figure 1B:
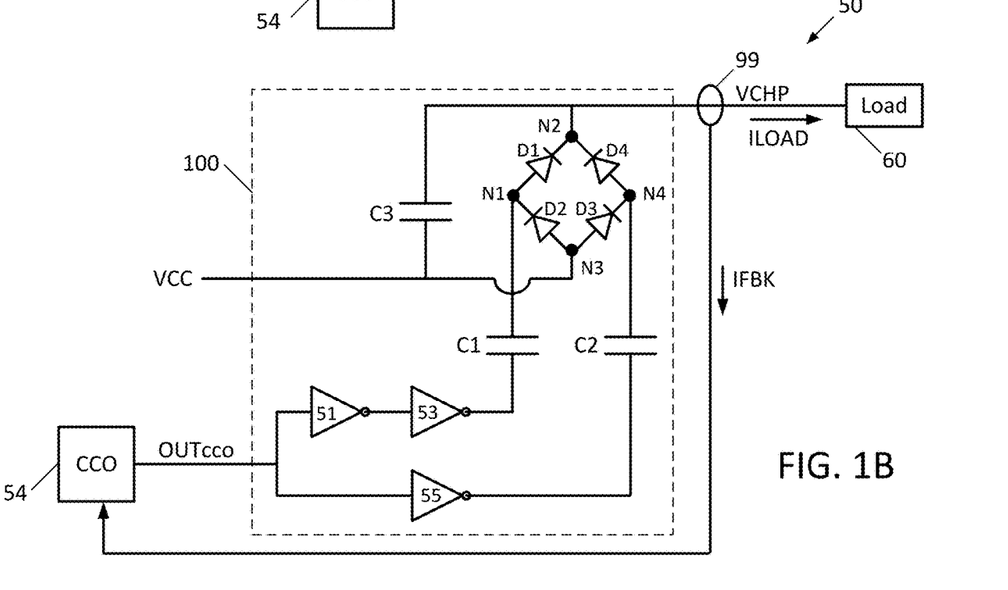
FIG. 1B is a schematic diagram of the electronic device of FIG. 1A showing the details of the charge pump circuit.

Further details of one example structure for the charge pump 100 of the electronic device 50 are shown in FIG. 1B, but it should be understood that any charge pump meeting the general description given above may be used. Here, inverters 51 and 55 receive the CCO output signal OUTcco as input. The inverter 51 provides an output to inverter 53. Capacitor C1 couples the output of the inverter 53 to node N1. Capacitor C2 couples the output of inverter 55 to node N4. A capacitor C3 is coupled between a supply node VCC and node N2.

A bridge rectifier is formed from diodes D1-D4. Diode D1 has its anode coupled to node N1 and its cathode coupled to node N2. Diode D2 has its cathode coupled to node N1 and its anode coupled to node N3. Diode D3 has its anode coupled to node N3 and its cathode coupled to node N4. Diode D4 has its anode coupled to node N4 and its cathode coupled to node N2.

Operation of the charge pump 100 will now be described. In this description, assume that "high" refers to a voltage of VCC, and that "low" refers to ground, although understand that in some applications other values may be used. For ease of explanation of the node and capacitor voltages, diode voltage drops will be ignored, but understand that the actual voltage values will be less than those stated due to voltage drops across the diodes D1-D4.

Consider a startup condition where neither C1 nor C2 are charged, and assume the CCO output signal OUTcco is low. This results in the output of the inverter 53 going low and the output of the inverter 55 going high. Since the output of the inverter 53 is low and capacitor C1 is not yet charged, node N1 will go low, diode D2 will become forward biased by VCC, and capacitor C1 will charge to VCC. At this time, since the output of the inverter 55 is high and the capacitor C2 is not yet charged, diode D3 will not become forward biased, so capacitor C2 does not charge.

When the CCO output signal OUTcco transitions high, the output of the inverter 53 will go high and the output of the inverter 55 will go low. Since the output of the inverter 53 is high, the potential at the output of the inverter 53 adds to potential stored in the capacitor C1, meaning that the voltage at node N1 will be 2*VCC. Since node N2 is at VCC, diode D1 will become forward biased, and capacitors C1 and C3 will share charge, with the result being that capacitor C3 will be charged to 1.5*VCC, assuming the capacitances of C1 and C3 are equal. Also at this time, since the output of the inverter 55 is low and capacitor C2 is not yet charged, node N4 will be low, the diode D3 will become forward biased by VCC, and capacitor C2 will charge to VCC.

This operation repeats. Therefore, for example, when the CCO output signal OUTcco transitions back low, the output of the inverter 53 will go low and the output of the inverter 55 will go high. Since the output of the inverter 55 is high, the potential at the output of the inverter 55 adds to the potential stored in the capacitor C2, meaning that the voltage at node N4 will be 2*VCC. Since node N2 is at VCC, diode D4 will become forward biased, and capacitors C2 and C3 will share charge, with the result being that capacitor C3 will be charged to 1.75*VCC.

Ultimately, through this pumping that occurs during each half cycle of the CCO output signal OUTcco, C3 will be charged to approximately 2*VCC.

Figure 1C:
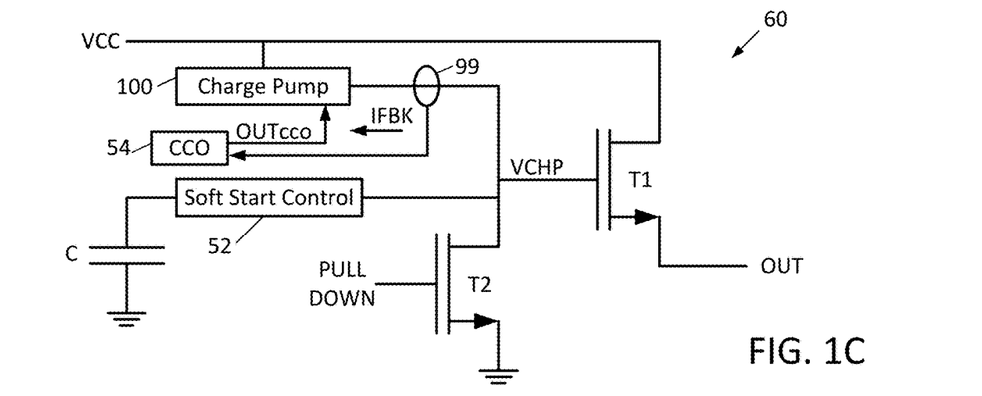
FIG. 1C is a block diagram of an embodiment of electronic device utilizing a charge pump circuit such as that of FIG. 1A-1B to drive a ballast transistor, in accordance with this disclosure.

A potential use of this charge pump 100 and the frequency regulation of its CCO 54 via the directly received feedback current IFBK is shown in the electronic device 60 shown in FIG. 1C. The electronic device 60 includes a charge pump 100 and CCO 54 that operate as described above. Here, the output VCHP of the charge pump 100 is used to bias the gate of a ballast NMOS transistor (power NMOS transistor) T1, which in turn provides an output OUT for use in powering other components (not shown). The ballast transistor T1 has its drain coupled to VCC and provides the output OUT at its source. The electronic device 60 also includes a pull down NMOS transistor T2 having its drain coupled to the gate of the ballast NMOS transistor T1, its source coupled to ground, and its gate biased by a pull down signal PULL DOWN. In addition, a soft start control circuit 52 is coupled to ground through capacitor C and provides bias to the ballast transistor T1 during startup when the charge pump 100 is charging up its output.

The advantages of the charge pump 100 and CCO 54 arrangement become readily apparent in the context of the electronic device 60. Once the gate of the ballast transistor T1 is sufficiently charged to place the ballast transistor T1 into a linear mode of operation, little to no current is drawn by the ballast transistor T1 from the charge pump 100. If the frequency of the CCO output signal OUTcco were constant, high switching losses within the charge pump 100 would increase the quiescent current consumed. However, using the arrangement shown where the feedback current IFBK controls the frequency of the CCO output signal OUTcco, the magnitude of the feedback current IFBK would be low once the gate of the ballast transistor T1 is sufficiently charged. This would result in the frequency of the CCO output signal OUTcco lowering, reducing switching losses, and therefore reducing power consumption of the electronic device 60. Indeed, the frequency of the CCO output signal OUTcco may go as low as (or in some cases lower than) 100 kHz in this instance, reducing switching losses by as much as sixty times. Where the magnitude of the feedback current IFBK is high to indicate that a high current is flowing into the gate of the ballast transistor T1, the frequency of the CCO output signal OUTcco may go as high as (or in some cases higher than) 6 MHz, maintaining VCHP at a constant level despite the high current draw.

Figure 2A:
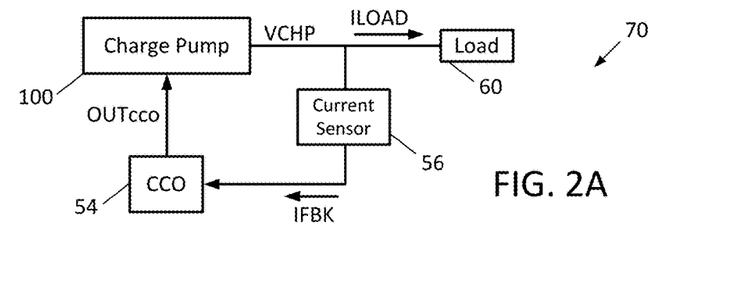
FIG. 2A is a block diagram of an electronic device utilizing another embodiment of a charge pump circuit to drive a load, in accordance with this disclosure.

Now disclosed with reference to FIG. 2A is an electronic device 70 including a charge pump circuit 100 to boost a supply voltage VCC to a charge pump output voltage VHCP which is applied to a load 60. The load 60 draws a load current ILOAD. A current sensor 56 senses the load current ILOAD and generates a feedback current IFBK that has a magnitude that is generally constant where the load current ILOAD is below a lower load current threshold, generally constant or asymptotically rising where the load current ILOAD is above an upper load current threshold, and related to (for example, being nearly proportional to, proportional to, directly proportional to, or in another relationship with) the load current ILOAD where the load current ILOAD is between the lower and upper load current thresholds.

Figure 4:
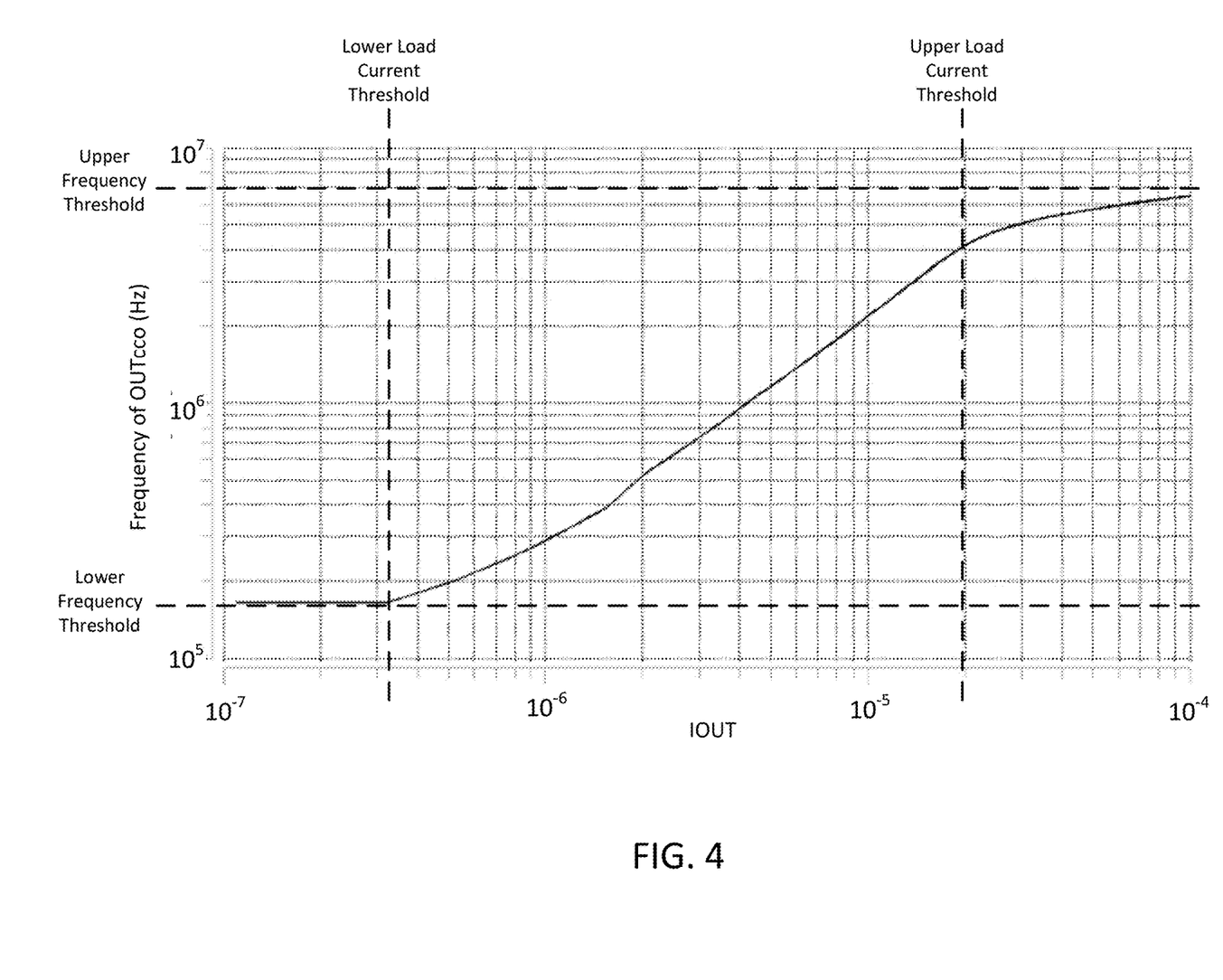
FIG. 4 is a graph showing load current vs frequency of the current controlled oscillator output signal for FIGS. 1A-1C, and 2A-2D.

Therefore, as can be seen in the graph of FIG. 4, the frequency of the CCO output signal OUTcco will be generally constant at a lower frequency threshold where the load current ILOAD is below a lower load current threshold, generally constant at or asymptotically rising to an upper frequency threshold where the load current ILOAD is above an upper load current threshold, and related to (for example, being nearly proportional to, proportional to, directly proportional to, or in another relationship with) the load current ILOAD where the load current ILOAD is between the lower and upper load current thresholds. As can be seen in FIG. 4, the frequency of the CCO output signal rises generally (but not perfectly) linearly where the load current ILOAD is between the lower and upper load current thresholds. The goal of the control of the frequency of the CCO output signal is to maintain the lowest possible output impedance of the charge pump 100 in all load conditions, keeping in mind the reduction of switching losses.

The purpose of this described generation of the feedback current IFBK by the current sensor 56 is to maintain the frequency of the CCO output signal OUTcco at a minimum nonzero threshold where the load current ILOAD is below the lower load current threshold to maintain VCHP at a generally constant level, to permit the frequency of the CCO output signal OUTcco to rise as the load current ILOAD rises to maintain VCHP at a generally constant level despite the increasing load current ILOAD, yet to protect the components of the charge pump 100 or current sensor 56 from damage if the load current ILOAD rises above the upper load current threshold.

Figure 2B:
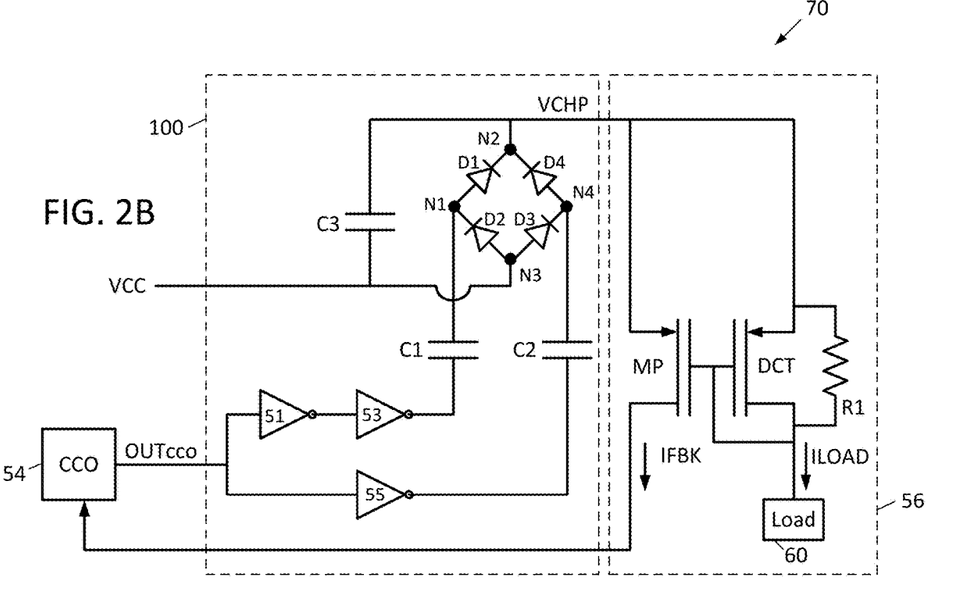
FIG. 2B is a schematic diagram of the electronic device of FIG. 2A showing the details of the charge pump circuit.

Further details of the current sensor 56 of the electronic device 70 are shown in FIG. 2B. Here, the CCO 54 and charge pump 100 are as described above with respect to FIG. 1B. The current sensor 56 includes a current sensing resistor R1 coupled between node N2 and the load 60. A PMOS transistor DCT has its source coupled to node N2, its drain coupled to the load 60, and its gate coupled to its drain. A PMOS transistor MP has its source coupled to node N2, its drain directly electrically connected to CCO 54 without intervening components, and its gate coupled to the gate and drain of the PMOS transistor DCT.

In operation, the PMOS transistors MP and DCT form a current mirror, with the drain of DCT forming the input of the current mirror and the drain of MP forming the output of the current mirror. Therefore, IFBK is a mirrored version of ILOAD, meaning that the frequency of the CCO output signal OUTcco will be related to the load current ILOAD. The current sensing performed by the current sensor 56 would function without the resistor R1, but the result would be a drop of 1*VGS on DCT. To overcome this drawback and to allow a higher VCHP in an unloaded state, the resistor R1 is utilized. Resistor R1 does not contribute to the current sensing, but instead is used to allow VOUT to reach VCHP in a completely unloaded state (where the gate of DCT is fully charged). The value of R1 can be high, such as 1 MΩ, whereas the native output impedance of the charge pump 100 at its maximum operating frequency can be 10 kΩ.

Therefore, until the voltage across R1 reaches the proper VGS to turn on DCT (prior to which current sensing is not functional), the output impedance of the charge pump 100 will be 1 MΩ. Once the voltage across R1 reaches the proper VGS to turn on DCT to begin current sensing, the output impedance drops and the CCO 54 begins tracking IFBK (and thus, ILOAD).

Put more simply, until the voltage drop across the resistor R1 is the required VGS of DCT, the current sensor 56 provides little to no current, meaning that DCT is in an off condition or in a subthreshold region. In this mode, the charge pump 100 runs at its minimum frequency. The benefit of this design of the current sensor 56 is that in an unloaded state, it draws no current from node N2, therefore allowing VCHP to be at its maximum possible value.

Figure 2C:
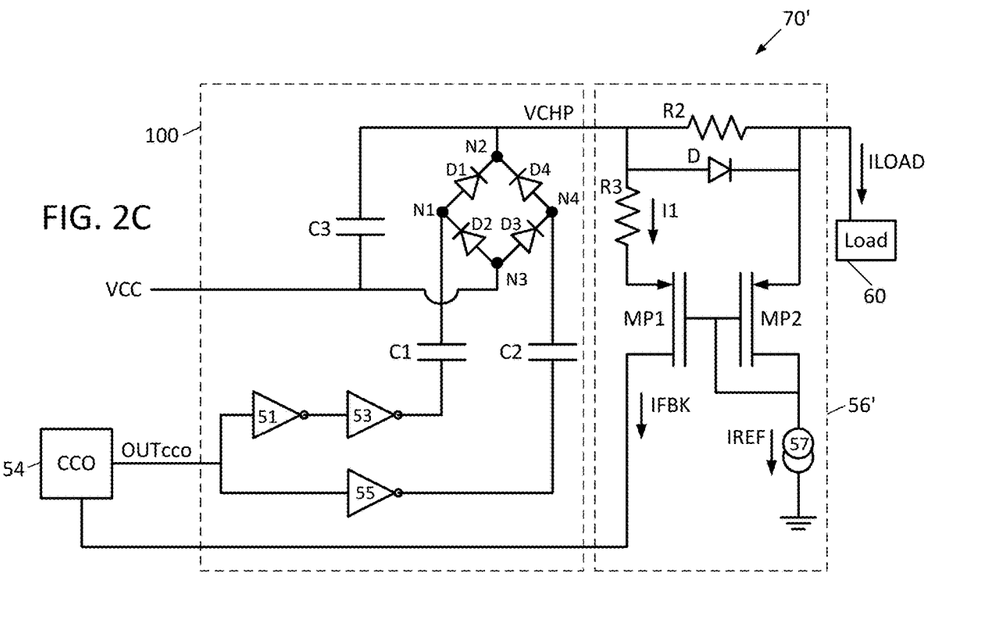
FIG. 2C is a schematic diagram of the electronic device of FIG. 2A showing details of another embodiment of the charge pump circuit.

Another embodiment of the current sensor 56' of the electronic device 70' is shown in FIG. 2C. Here, the CCO 54 and charge pump 100 are as described above with respect to FIG. 2B. The current sensor 56' includes a current sensing resistor R2 coupled between node N2 and the load 60. A diode D is coupled between node N2 and the load 60. A resistor R3 is coupled between node N2 and a source of a PMOS transistor MP1. A drain of PMOS transistor MP1 produces the feedback current IFBK and is directly electrically connected to the CCO 54 without any intervening components. A PMOS transistor MP2 has its source coupled to the load 60, its drain coupled to current source 57, and its gate coupled to its drain and to the gate of PMOS transistor MP1.

In operation, if the load current ILOAD is zero, then the source voltages of PMOS transistors MP1 and MP2 will be equal, and the PMOS transistors MP1 and MP2 will act as a current mirror, resulting in the reference current IREF (e.g. 100 nA) being mirrored to the drain of PMOS transistor MP1 as the feedback current IFBK. The minimum magnitude that IFBK will reach will be below the minimum current defined inside the CCO 54. Therefore, the minimum frequency of OUTcco will be precisely defined inside the CCO 54. Once IFBK becomes higher than the minimum current inside the CCO 54, the frequency of OUTcco becomes a function of IFBK.

If the load current ILOAD is nonzero, but the voltage across resistor R2 (resulting from the load current ILOAD flowing through R2) is insufficient to forward bias the diode D, then the source voltages of PMOS transistors MP1 and MP2 will be unequal, and current mirror operation will be unbalanced. In this condition, the load current ILOAD will control biasing of the PMOS transistor MP1, and the feedback current IFBK will be related to (for example, being nearly proportional to, proportional to, directly proportional to, or in another relationship with) the load current ILOAD.

Once the voltage across resistor R2 becomes sufficient to forward bias the diode D, the diode D will clamp the resistor R2, lowering the output impedance of the charge pump 54 under high load conditions. Prior to diode D becoming forward biased, the CCO 54 outputs OUTcco at its maximum output frequency. Also in this case, the maximum frequency of OUTcco will be defined inside the CCO, not by IFBK from the current sensor 56.

Note that in the design of FIG. 2C, the load current ILOAD does not pass through MP2, but instead passes through R2 and at higher current also passes through diode D. The current source IREF is used for pre-biasing the current mirror formed by PMOS transistors MP1 and MP2, resulting in a small magnitude of the feedback current IFBK in an unloaded state. However, IFBK in this state is not to be used for setting the minimum frequency of OUTcco, but instead the minimum frequency of OUTcco is set directly in the CCO 54 itself.

Therefore, a primary advantage of the design of FIG. 2C is that current sensing starts from very low load current ILOAD magnitude levels, because the current sensing is based on ΔVGS of PMOS transistors MP2 and MP1. The current sensing functions until the voltage drop across R2 saturates at the forward voltage of diode D. At this point, the CCO 54 is already outputting OUTcco at its maximum frequency. The diode D helps to guarantee minimum output impedance in heavily loaded state. Note, however, that with this design, some current from the charge pump 100 is consumed in an unloaded state.

Figure 2D:
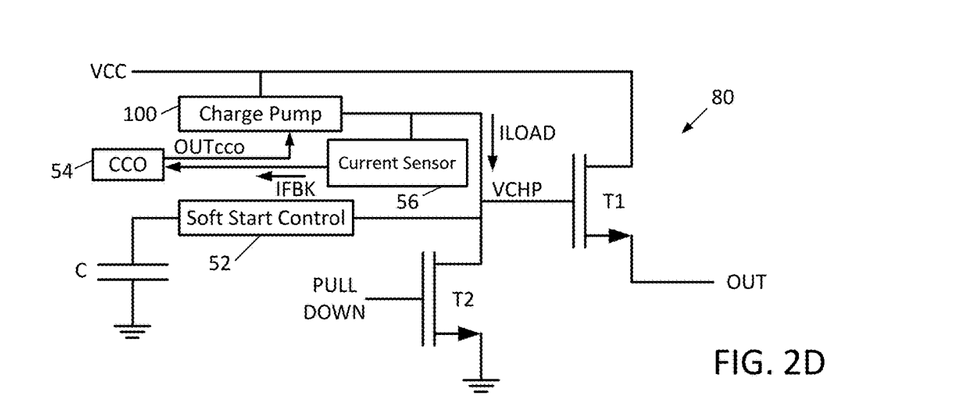
FIG. 2D is a block diagram of an embodiment of an electronic device utilizing a charge pump circuit such as that of FIGS. 2A-2C to drive a ballast transistor, in accordance with this disclosure.

A potential use of this charge pump 100 and the frequency regulation of its CCO 54 via the feedback current IFBK is shown in the electronic device 80 of FIG. 2D. The electronic device 80 includes a charge pump 100 and CCO 54 that operate as described above. Here, the output VCHP of the charge pump 100 is used to bias the gate of a ballast NMOS transistor (power NMOS transistor) T1, which in turn provides an output OUT for use in powering other components (not shown). The ballast transistor T1 has its drain coupled to VCC and provides the output OUT at its source. The electronic device 60 also includes a pull down NMOS transistor T2 having its drain coupled to the gate of the ballast NMOS transistor T2, its source coupled to ground, and its gate biased by a pull down signal PULL DOWN. In addition, a soft start control circuit 52 is coupled to ground through capacitor C2 and provides bias to the ballast transistor T1 during startup when the charge pump 100 is charging up its output.

The advantages of the charge pump 100 and CCO 54 arrangement become readily apparent in the context of the electronic device 80. Once the gate of the ballast transistor T1 is sufficiently charged to place the ballast transistor T1 into a linear mode of operation, little to no current is drawn by the ballast transistor T1 from the charge pump 100. If the frequency of the CCO output signal OUTcco were constant, high switching losses within the charge pump 100 would increase the quiescent current consumed. However, using the arrangement shown, the feedback current IFBK would be low once the gate of the ballast transistor T1 is sufficiently charged, with the result being that the frequency of the CCO output signal OUTcco would lower, reducing switching losses, and therefore reduce power consumption of the electronic device 60. Indeed, the frequency of the CCO output signal OUTcco may go as low as (or in some cases lower than) 100 kHz in this instance, reducing switching losses by as much as sixty times. Where the feedback current IFBK is high to indicate that a high current is flowing into the gate of the ballast transistor T1, the frequency of the CCO output signal OUTcco may go as high as (or in some cases higher than) 6 MHz, maintaining VCHP at a constant level despite the high current draw.

Figure 5:
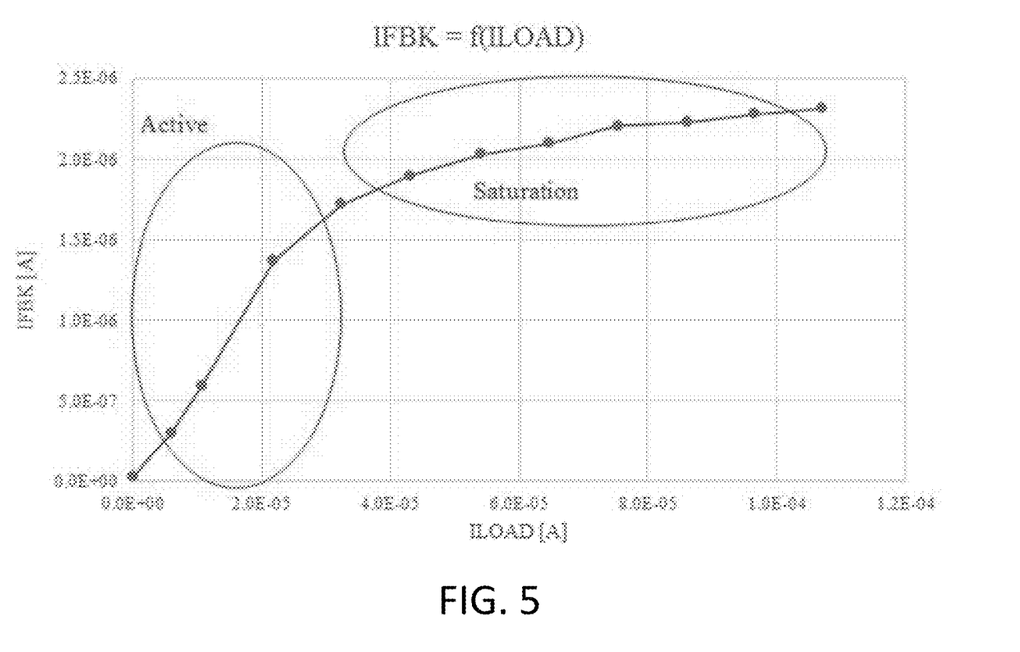
FIG. 5 is a graph showing real feedback current characteristics versus load current of charge pump circuit of FIG. 2C.

Shown in FIG. 5 is feedback current IFBK vs. load current ILOAD for the charge pump circuit of FIG. 2C. As can be seen, the feedback current IFBK is relatively proportional to the load current ILOAD until saturation of the current sensor 56' occurs, at which point the feedback current IFBK rises asymptotically toward a maximum current.

Figure 6:
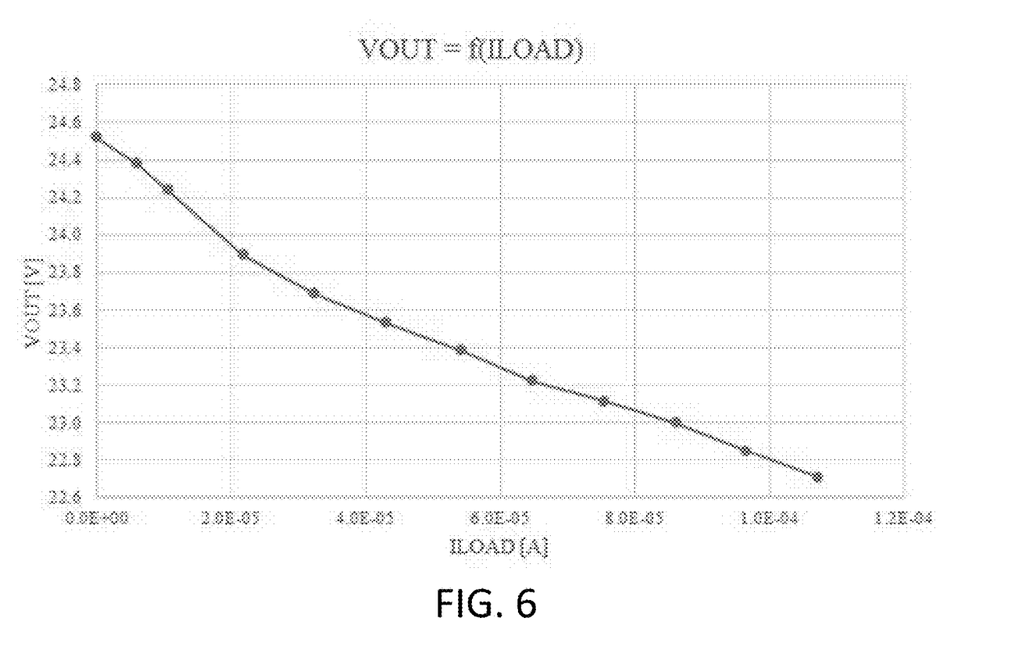
FIG. 6 is a graph showing load supply characteristics of the charge pump circuit of FIG. 2C.

Shown in FIG. 6 is a graph showing output voltage VOUT vs load current ILOAD for the charge pump circuit 100 of FIG. 2C.

Figure 3:
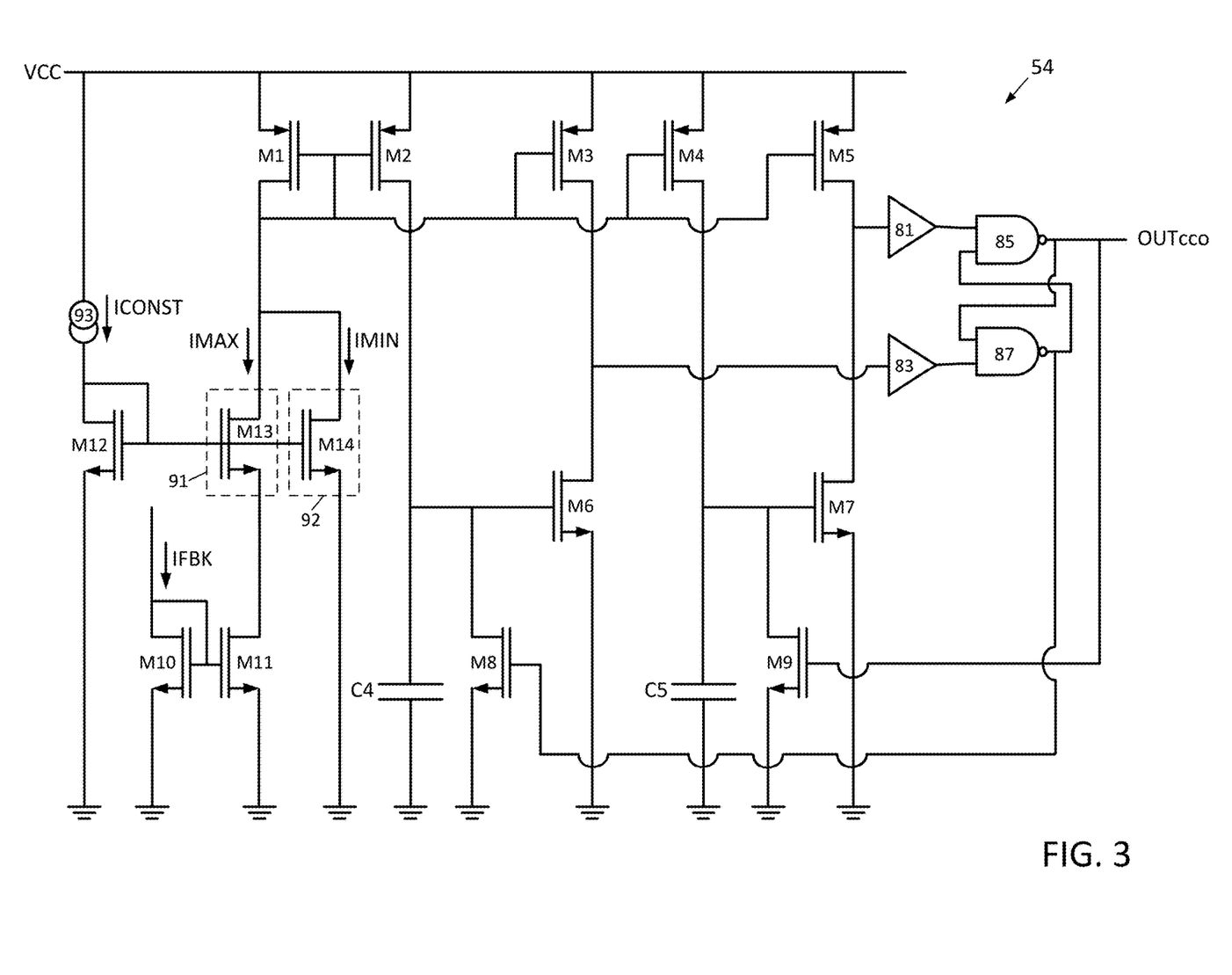
FIG. 3 is a schematic diagram of a current controlled oscillator such as may be used in FIGS. 1A-1C and 2A-2D.

Now described with reference to FIG. 3 is an example CCO 54 such as may be used with the devices shown in FIGS. 1A-1C, and 2A-2D. A detailed description will be given below, but first a brief description will be given. Briefly, the structure of the CCO 54 is a low power oscillator that has been designed as 2-phase structure for achieving minimum switching losses. Timing of one clock phase is defined by components M2, C4, M6 and M3 and the timing of the other clock phase is defined by components M4, C5, M7 and M5. Devices M8 and M9 are used for resetting the capacitors. This CCO structure generates a symmetric square wave signal with approximately a 50:50 ratio between pulse and gap (depending on the matching of components between first and second phase).

In greater detail, the CCO 54 includes PMOS transistors M1-M5 coupled in a current mirror arrangement. The sources of PMOS transistors M1-M5 are coupled to VCC, and the gates of PMOS transistors M1-M5 are coupled to one another and to the drain of PMOS transistor M1.

A first current source 91 draws a maximum CCO current IMAX from the drain of PMOS transistor M1, and a second current source 92 draws a minimum CCO current IMIN from the drain of PMOS transistor M1. A current mirror is formed from NMOS transistors M10 and M11. The drain of M11 is coupled to the current source 91, the source of M11 is coupled to ground, and the gate of M11 is coupled to the gate and drain of M10. The drain of M10 is coupled to receive IFBK and to the gate of M10, and the source of M10 is coupled to ground.

A capacitor C4 is coupled between the drain of PMOS transistor M2 and ground. An NMOS transistor M6 has its gate coupled to the drain of PMOS transistor M2, its drain coupled to the drain of PMOS transistor M3, and its source coupled to ground. A capacitor C5 is coupled between the drain of PMOS transistor M4 and ground. An NMOS transistor M7 has its drain coupled to the drain of PMOS transistor M5, its source coupled to ground, and its gate coupled to the drain of PMOS transistor M4.

A buffer 81 has its input coupled to the drain of PMOS transistor M5 and has its output coupled to a first input of NAND gate 85. A buffer 83 has its input coupled to the drain of PMOS transistor M3 and has its output coupled to a first input of NAND gate 87. The output of NAND gate 85 is coupled to the second input of NAND gate 87, and the output of NAND gate 87 is coupled to the second input of NAND Gate 85, thereby forming an SR flip flop. An NMOS transistor M8 has its drain coupled to the drain of PMOS transistor M2, its source coupled to ground, and its gate coupled to the output of NAND gate 87. An NMOS transistor M9 has its drain coupled to the drain of PMOS transistor M4, its source coupled to ground, and its gate coupled to the output of NAND gate 85. The CCO output signal OUTcco is produced at the output of NAND gate 85.

The feedback current IFBK is received by the current mirror formed from NMOS transistors M10 and M11. If IFBK is zero, then the bias current for M1 is defined by the current IMIN drawn from the current source 92, setting for example a frequency for OUTcco to 100 kHz. If the feedback current IFBK is higher than the current IMAX drawn from the current source 91, then the bias current for M1 is the sum of the currents IMIN drawn from the current source 92 and IMAX, setting for example a frequency for OUTcco to 6 MHz because the drain current of M11 is limited by the current source 91. If the feedback current IFBK is between IMAX and IMIN, then the bias current for M1 is proportional to IFBK.

To understand operation, assume an operating state where the output of buffer 81 is high and the output of buffer 83 is low. The output of the buffer 83 being low results in the output of the NAND gate 87 being high, which means that the output of NAND gate 85 (and thus the CCO output signal OUTcco) will be low. The output of NAND gate 85 being low while the output of buffer 83 is low serves to maintain the output of NAND gate 87 high, and thus the output of NAND gate 85 is stable at this point.

The output of NAND gate 87 being high turns on transistor M8, so at this point capacitor C4 does not charge. The output of NAND gate 85 being low turns off NMOS transistor M9, so capacitor C5 will be charged by PMOS transistor M4. Therefore, once capacitor C5 is sufficiently charged to turn on transistor M7, current will be sunk from the input of buffer 81, and the output of buffer 81 will go low, pulling the output of NAND gate 85 (and thus the CCO output signal OUTcco) high, turning on transistor M9 and discharging capacitor C5.

NAND gate 85 still being high at this point will cause the output of the NAND gate 87 to go low, which will turn off transistor M8, and capacitor C4 will begin to be charged by PMOS transistor M2. Once capacitor C4 is sufficiently charged to turn on transistor M6, current will be sunk from the input of the buffer 83, the output of the buffer 83 will go low, the output of the NAND gate 87 will go high, and the initial condition described above is returned to. This operation continues cycling, generating CCO output signal OUTcco as having a frequency dependent on the time it takes for capacitors C4 and C5 to charge. The quicker capacitors C4 and C5 charge, the higher the frequency of the CCO output signal OUTcco will be; the slower capacitors C4 and C5 charge, the lower the frequency of the CCO output signal OUTcco will be. Since the charging time for capacitors C4 and C5 is proportional to the magnitude of the bias current for M1 (such as feedback current IFBK in some operating conditions as explained above), this means that the frequency of the CCO output signal OUTcco will be proportional to the magnitude of the feedback current IFBK.

The current source 91 is formed by NMOS transistor M13 which has its drain coupled to the drain of PMOS transistor M1, its source coupled to the drain of NMOS transistor M11, and its gate coupled to the gate of M12. The current source 92 is formed by NMOS transistor M14 which has its drain coupled to the drain of PMOS transistor M1, its source coupled to ground, and its gate coupled to the gates of NMOS transistors M13 and M12. NMOS transistor M12 has its drain coupled to current source 93 to receive a constant current, its source coupled to ground, and its gate coupled to the gates of NMOS transistors M13 and M14.

This is but one CCO 54 design that may be used with the devices shown in FIGS. 1A-1C and 2A-2D. It should be appreciated that other CCO designs may also be suitable.

It should be understood that the operation of the CCO 54 based upon the received feedback signal IFBK is not pulse skipping and cannot be considered to be a pulse skipping mode. Although the frequency of the CCO output signal OUTcco varies, it does not skip pulses as understood by those of skill in the art, and the pulses of the CCO output signal OUTcco instead are continuously generated.

While the disclosure has been described with respect to a limited number of embodiments, those skilled in the art, having benefit of this disclosure, will appreciate that other embodiments can be envisioned that do not depart from the scope of the disclosure as disclosed herein. Accordingly, the scope of the disclosure shall be limited only by the attached claims.

The invention claimed is:
1. A circuit, comprising:
a current controlled oscillator (CCO);
a charge pump circuit configured to boost a supply voltage in response to an output from the CCO to produce a charge pump output voltage at a charge pump output node; and
a current sensing circuit comprising:
a first resistor coupled between the charge pump output node and a circuit output node;
a first transistor having a first conduction terminal coupled to the charge pump output node through a second resistor, a second conduction terminal coupled to an input of the CCO, and a control terminal; and
a second transistor having a first conduction terminal coupled to the circuit output node, a second conduction terminal coupled to a reference current source, and a control terminal coupled to the control terminal of the first transistor and to the second conduction terminal of the second transistor.

2. The circuit of claim 1, wherein the current sensing circuit further comprises a diode coupled between the charge pump output node and the circuit output node.

3. The circuit of claim 2, wherein the diode has an anode coupled to the charge pump output node and a cathode coupled to the circuit output node.

4. The circuit of claim 1, wherein:
the first transistor comprises a p-channel transistor having a source coupled to the charge pump output node through the second resistor, a drain coupled to the input of the CCO, and a gate; and
the second transistor comprises a p-channel transistor having a source coupled to the circuit output node, a drain coupled to the reference current source, and a gate coupled to the drain of the second transistor as well as to the gate of the first transistor.

5. The circuit of claim 1, wherein the CCO is coupled to a first node of the charge pump circuit through a pair of series coupled inverters and a first capacitor, and is coupled to a fourth node of the charge pump circuit through an inverter and a second capacitor; and wherein the charge pump circuit has a second node coupled to the charge pump output node and has its third node coupled to the supply voltage.

6. The circuit of claim 5, further comprising a third capacitor coupled between the second node and the third node of the charge pump circuit.

7. The circuit of claim 6, wherein the charge pump circuit includes:
a first diode coupled between the first node and the second node;
a second diode coupled between the third node and the first node;
a third diode coupled between the third node and the fourth node; and
a fourth diode coupled between the fourth node and the second node.

8. A circuit, comprising:
a current controlled oscillator (CCO) configured to generate a CCO output signal at a CCO output that has a frequency that is generally proportional to a feedback current;
a charge pump circuit operated by the CCO output signal and configured to boost a supply voltage to produce a charge pump output voltage at a circuit output, wherein the circuit output is coupled to a load; and
a current sensing circuit configured to sense a load current drawn by the load and to generate the feedback current as having a magnitude that varies as a function of the sensed load current if a magnitude of the load current is between a lower load current threshold and an upper load current threshold, wherein the current sensing circuit comprises:
a first resistor coupled between a node and the circuit output;
a diode coupled between the node and the circuit output;
a second resistor having a first terminal coupled to the node;
a first transistor having a first conduction terminal coupled to a second terminal of the second resistor, a second conduction terminal coupled to the CCO, and a control terminal; and
a second transistor having a first conduction terminal coupled to the circuit output, a second conduction terminal coupled to a reference current source to receive a reference current therefrom, and a control terminal to the control terminal of the first transistor and to the second conduction terminal of the second transistor;
wherein the first transistor generates the feedback current at its second conduction terminal.

9. The circuit of claim 8, wherein:
the first resistor is directly electrically connected between the node and the circuit output; and
the diode is directly electrically connected between the node and the circuit output.

10. The circuit of claim 9, wherein:
the second resistor has its first terminal directly electrically connected to the node;
the first transistor is a p-channel transistor having a source directly electrically connected to the second terminal of the second resistor, a drain directly electrically connected to the CCO, and a gate;
the second transistor is a p-channel transistor having a source directly electrically connected to the circuit output, a drain directly electrically connected to the reference current source to receive the reference current therefrom, and a gate directly electrically coupled to the gate of the first transistor and to the drain of the second transistor; and
wherein the first transistor generates the feedback current at its drain.

11. The circuit of claim 8, wherein the second conduction terminal of the first transistor is directly electrically connected to the CCO in an unbroken fashion without intervening components such that the feedback current flows directly from the node into the CCO.

12. A circuit, comprising:
a current controlled oscillator (CCO) having a CCO input and a CCO output;
a charge pump circuit comprising:
first, second, and third capacitors;
first and second inverters coupled in series between the CCO output and a first plate of the first capacitor;
a third inverter coupled between the CCO output and a first plate of the second capacitor; and
a bridge rectifier comprising:
a first diode coupled between a first node and a second node;
a second diode coupled between the first node and a third node;
a third diode coupled between the third node and a fourth node; and
a fourth diode coupled between the fourth node and the second node;
wherein a second plate of the first capacitor is coupled to the first node;
wherein a second plate of the second capacitor is coupled to the fourth node; and
wherein the third capacitor has a first plate coupled to a supply voltage and the third node and a second plate coupled the second node; and
a current sensing circuit comprising:
a first resistor coupled between the second node and a circuit output;
a diode coupled between the second node and the circuit output;
a second resistor having a first terminal coupled to the second node;
a first transistor having a first conduction terminal coupled to a second terminal of the second resistor, a second conduction terminal coupled to the CCO input, and a control terminal; and a second transistor having a first conduction terminal coupled to the circuit output, a second conduction terminal coupled to a reference current source to receive a reference current therefrom, and a control terminal coupled to the control terminal of the first transistor and to the second conduction terminal of the second transistor.

13. The circuit of claim 12, wherein:
the first diode has an anode coupled to the first node and a cathode coupled to the second node;
the second diode has a cathode coupled to the first node and an anode coupled to the third node;
the third diode has an anode coupled to the third node and a cathode coupled to the fourth node; and
the fourth diode has an anode coupled to the fourth node and a cathode coupled to the second node.

14. The circuit of claim 13, wherein:
the first resistor is directly electrically connected between the second node and the circuit output; and
the diode of the current sensing circuit is directly electrically connected between the second node and the circuit output.

15. The circuit of claim 14, wherein:
the first transistor is a p-channel transistor having a source directly electrically connected to the second terminal of the second resistor, a drain directly electrically connected to the CCO input, and a gate; and
the second transistor is a p-channel transistor having a source directly electrically connected to the circuit output, a drain directly electrically connected to the reference current source to receive the reference current therefrom, and a gate directly electrically coupled to the gate of the first transistor and to the drain of the second transistor.

16. The circuit of claim 15, wherein the drain of the first transistor is directly electrically connected to the CCO input in an unbroken fashion without intervening components.

* * * * *